United States Patent
Tamada et al.

(10) Patent No.: US 6,519,186 B2
(45) Date of Patent: Feb. 11, 2003

(54) NON-VOLATILE SEMICONDUCTOR MEMORY DEVICE CONFIGURED TO READ DATA AT A HIGH SPEED

(75) Inventors: Satoru Tamada, Tokyo (JP); Hidenori Mitani, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/822,365

(22) Filed: Apr. 2, 2001

(65) Prior Publication Data

US 2002/0024850 A1 Feb. 28, 2002

(30) Foreign Application Priority Data

Aug. 29, 2000 (JP) ..................... P2000-258984

(51) Int. Cl.[7] ............................................. G11C 16/04
(52) U.S. Cl. ............................ 365/185.33; 365/185.03
(58) Field of Search ..................... 365/185.03, 185.33, 365/221; 713/2

(56) References Cited

U.S. PATENT DOCUMENTS

| 4,984,214 A | * | 1/1991 | Hiltebeitel et al. | .... 365/230.02 |
| 5,959,882 A | * | 9/1999 | Yoshida et al. | ........ 365/185.03 |
| 6,058,044 A | * | 5/2000 | Sugiura et al. | ........ 365/185.17 |
| 6,198,649 B1 | * | 3/2001 | Matsudera et al. | .... 365/189.05 |
| 6,341,239 B1 | * | 1/2002 | Hayashi et al. | ............... 700/79 |

FOREIGN PATENT DOCUMENTS

| JP | 04-119594 | 4/1992 |
| JP | 10-011979 | 1/1998 |
| JP | 10-011982 | 1/1998 |
| JP | 10-092186 | 4/1998 |
| JP | 10-334674 | 12/1998 |
| JP | 11-176960 | 7/1999 |

* cited by examiner

*Primary Examiner*—Richard Elms
*Assistant Examiner*—VanThu Nguyen
(74) *Attorney, Agent, or Firm*—McDermott, Will & Emery

(57) ABSTRACT

A non-volatile semiconductor memory device includes, a plurality of word lines, a plurality of bit lines, a plurality of memory circuits, and a reading circuit. A plurality of bits are memorized at each memory cell. The plurality of bit lines lie at right angle to the word lines. The reading circuit is configured to read certain data from every (n−1)th (n is an integer that is greater than two) memory cell of a memory cell array that is connecting to at least a word line. The memory cell exists on the point of intersection with the word line and the bit line. Then data reading and data writing are made by applying the voltage on the word line and the bit line. The non-volatile semiconductor memory device is electrically rewritable.

16 Claims, 20 Drawing Sheets

Fig.2

| | LOWER BIT | UPPER BIT | |
|---|---|---|---|
| Y420H | I/O 0 | I/O 4 | P0 |
| Y000H | I/O 0 | I/O 4 | P1 |
| Y420H | I/O 1 | I/O 5 | P0 |
| Y000H | I/O 1 | I/O 5 | P1 |

⋮

| | | | |
|---|---|---|---|
| Y7FFH | I/O 3 | I/O 7 | P0 |
| Y3DFH | I/O 3 | I/O 7 | P1 |
| Y800H | I/O 0 | I/O 4 | P0 |
| Y3E0H | I/O 0 | I/O 4 | P1 |
| Y800H | I/O 1 | I/O 5 | P0 |
| Y3E0H | I/O 1 | I/O 5 | P1 |
| Y800H | I/O 2 | I/O 6 | P0 |
| Y3E0H | I/O 2 | I/O 6 | P1 |
| Y800H | I/O 3 | I/O 7 | P0 |
| Y3E0H | I/O 3 | I/O 7 | P1 |

⋮

| | | | |
|---|---|---|---|
| Y83FH | I/O 2 | I/O 6 | P0 |
| Y41FH | I/O 2 | I/O 6 | P1 |
| Y83FH | I/O 3 | I/O 7 | P0 |
| Y41FH | I/O 3 | I/O 7 | P1 |

Fig.4

| LOWER BIT | | UPPER BIT | | |
|---|---|---|---|---|
| Y000H | I/O 0 | Y420H | I/O 0 | P0 |
|  | I/O 1 |  | I/O 1 | P1 |
|  | I/O 2 |  | I/O 2 | P0 |
|  | I/O 3 |  | I/O 3 | P1 |

⋮

| | | | | |
|---|---|---|---|---|
| Y3DFH | I/O 0 | Y7FFH | I/O 0 | P0 |
|  | I/O 1 |  | I/O 1 | P1 |
|  | I/O 2 |  | I/O 2 | P0 |
|  | I/O 3 |  | I/O 3 | P1 |
|  | I/O 4 |  | I/O 4 | P0 |
|  | I/O 5 |  | I/O 5 | P1 |
|  | I/O 6 |  | I/O 6 | P0 |
|  | I/O 7 |  | I/O 7 | P1 |
| Y3E0H | I/O 0 | Y800H | I/O 0 | P0 |
|  | I/O 1 |  | I/O 1 | P1 |
|  | I/O 2 |  | I/O 2 | P0 |
|  | I/O 3 |  | I/O 3 | P1 |
|  | I/O 4 |  | I/O 4 | P0 |
|  | I/O 5 |  | I/O 5 | P1 |
|  | I/O 6 |  | I/O 6 | P0 |
|  | I/O 7 |  | I/O 7 | P1 |

⋮

| | | | | |
|---|---|---|---|---|
| Y41FH | I/O 4 | Y83FH | I/O 4 | P0 |
|  | I/O 5 |  | I/O 5 | P1 |
|  | I/O 6 |  | I/O 6 | P0 |
|  | I/O 7 |  | I/O 7 | P1 |

Fig.6

| LOWER BIT | | UPPER BIT | | |
|---|---|---|---|---|
| Y210H | I/O 0 | Y630H | I/O 0 | P0 |
| Y000H | I/O 0 | Y420H | I/O 0 | P1 |
| Y210H | I/O 1 | Y630H | I/O 1 | P0 |
| Y000H | I/O 1 | Y420H | I/O 1 | P1 |
| ⋮ | | | | |
| Y3DFH | I/O 6 | Y7FFH | I/O 6 | P0 |
| Y1CFH | I/O 6 | Y5EFH | I/O 6 | P1 |
| Y3DFH | I/O 7 | Y7FFH | I/O 7 | P0 |
| Y1CFH | I/O 7 | Y5EFH | I/O 7 | P1 |
| Y3E0H | I/O 0 | Y800H | I/O 0 | P0 |
| Y1D0H | I/O 0 | Y5F0H | I/O 0 | P1 |
| Y3E0H | I/O 1 | Y800H | I/O 1 | P0 |
| Y1D0H | I/O 1 | Y5F0H | I/O 1 | P1 |
| Y3E0H | I/O 2 | Y800H | I/O 2 | P0 |
| Y1D0H | I/O 2 | Y5F0H | I/O 2 | P1 |
| Y3E0H | I/O 3 | Y800H | I/O 3 | P0 |
| Y1D0H | I/O 3 | Y5F0H | I/O 3 | P1 |
| ⋮ | | | | |
| Y41FH | I/O 6 | Y83FH | I/O 6 | P0 |
| Y20FH | I/O 6 | Y62FH | I/O 6 | P1 |
| Y41FH | I/O 7 | Y83FH | I/O 7 | P0 |
| Y20FH | I/O 7 | Y62FH | I/O 7 | P1 |

Fig.8

| LOWER BIT | | UPPER BIT | | |
|---|---|---|---|---|
| Y420H | I/O 0 | Y000H | I/O 0 | P0 |
| Y630H | I/O 0 | Y210H | I/O 0 | P1 |
| Y420H | I/O 1 | Y000H | I/O 1 | P0 |
| Y630H | I/O 1 | Y210H | I/O 1 | P1 |

⋮

| | | | | |
|---|---|---|---|---|
| Y5EFH | I/O 6 | Y1CFH | I/O 6 | P0 |
| Y7FFH | I/O 6 | Y3DFH | I/O 6 | P1 |
| Y5EFH | I/O 7 | Y1CFH | I/O 7 | P0 |
| Y7FFH | I/O 7 | Y3DFH | I/O 7 | P1 |
| Y5F0H | I/O 0 | Y1D0H | I/O 0 | P0 |
| Y800H | I/O 0 | Y3E0H | I/O 0 | P1 |
| Y5F0H | I/O 1 | Y1D0H | I/O 1 | P0 |
| Y800H | I/O 1 | Y3E0H | I/O 1 | P1 |
| Y5F0H | I/O 2 | Y1D0H | I/O 2 | P0 |
| Y800H | I/O 2 | Y3E0H | I/O 2 | P1 |
| Y5F0H | I/O 3 | Y1D0H | I/O 3 | P0 |
| Y800H | I/O 3 | Y3E0H | I/O 3 | P1 |

⋮

| | | | | |
|---|---|---|---|---|
| Y62FH | I/O 6 | Y20FH | I/O 6 | P0 |
| Y83FH | I/O 6 | Y41FH | I/O 6 | P1 |
| Y62FH | I/O 7 | Y20FH | I/O 7 | P0 |
| Y83FH | I/O 7 | Y41FH | I/O 7 | P1 |

Fig.9
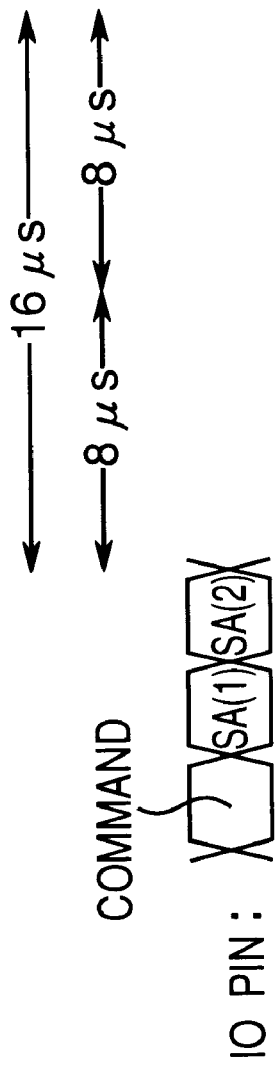 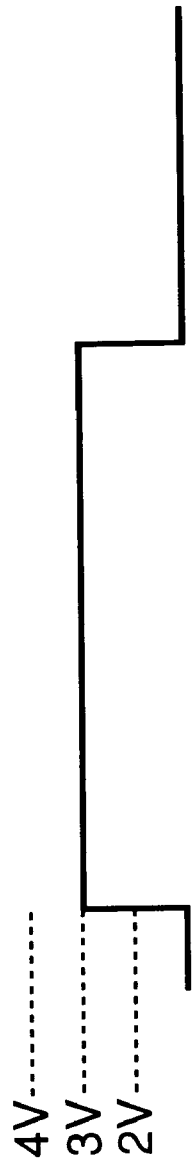  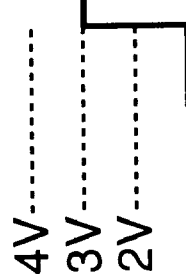

Fig.12

| | #0000 | #07FF | #0800 #083F |
|---|---|---|---|
| #3FFF | UNUSED | | CONTROL DATA |
| | USER DATA | | CONTROL DATA |
| | USER DATA | | CONTROL DATA |
| | USER DATA | | CONTROL DATA |
| | USER DATA | | CONTROL DATA |
| | USER DATA | | CONTROL DATA |
| | USER DATA | | CONTROL DATA |
| | USER DATA | | CONTROL DATA |
| | USER DATA | | CONTROL DATA |
| | USER DATA | | CONTROL DATA |
| | UNUSED | | CONTROL DATA |
| | UNUSED | | CONTROL DATA |
| | UNUSED | | CONTROL DATA |
| | USER DATA | | CONTROL DATA |
| | USER DATA | | CONTROL DATA |
| | USER DATA | | CONTROL DATA |
| | USER DATA | | CONTROL DATA |
| | USER DATA | | CONTROL DATA |
| | USER DATA | | CONTROL DATA |
| | USER DATA | | CONTROL DATA |
| | UNUSED | | CONTROL DATA |
| | | | FAT INFORMATION |
| | | | FAT INFORMATION |
| | | | SYSTEM SOFTWARE |
| #0000 | | | SYSTEM SOFTWARE |

Fig. 13

| | #0000 | #020F | #0210 | #041F | #0420 | #062F | #0630 | #083F |
|---|---|---|---|---|---|---|---|---|
| #3FFF | USER DATA | USER DATA | USER DATA | USER DATA | USER DATA | USER DATA | USER DATA | USER DATA |
| | USER DATA | USER DATA | USER DATA | USER DATA | USER DATA | USER DATA | USER DATA | USER DATA |
| | USER DATA | USER DATA | USER DATA | USER DATA | USER DATA | USER DATA | USER DATA | USER DATA |
| | USER DATA | USER DATA | USER DATA | USER DATA | USER DATA | USER DATA | USER DATA | USER DATA |
| | USER DATA | USER DATA | USER DATA | USER DATA | USER DATA | USER DATA | USER DATA | USER DATA |
| | USER DATA | USER DATA | USER DATA | USER DATA | USER DATA | USER DATA | USER DATA | USER DATA |
| | USER DATA | USER DATA | USER DATA | USER DATA | USER DATA | USER DATA | USER DATA | USER DATA |
| | USER DATA | USER DATA | USER DATA | USER DATA | USER DATA | USER DATA | USER DATA | USER DATA |
| | USER DATA | USER DATA | USER DATA | USER DATA | USER DATA | USER DATA | USER DATA | USER DATA |
| | USER DATA | USER DATA | USER DATA | USER DATA | USER DATA | USER DATA | USER DATA | USER DATA |
| | USER DATA | USER DATA | USER DATA | USER DATA | USER DATA | USER DATA | USER DATA | USER DATA |
| | USER DATA | USER DATA | USER DATA | CONTROL DATA | | | | |
| | CONTROL DATA | CONTROL DATA | CONTROL DATA | CONTROL DATA | | | | |
| | CONTROL DATA | CONTROL DATA | CONTROL DATA | CONTROL DATA | | | | |
| | CONTROL DATA | CONTROL DATA | CONTROL DATA | CONTROL DATA | | | | |
| | CONTROL DATA | CONTROL DATA | CONTROL DATA | CONTROL DATA | | | | |
| | CONTROL DATA | CONTROL DATA | CONTROL DATA | CONTROL DATA | | | | |
| | CONTROL DATA | CONTROL DATA | CONTROL DATA | CONTROL DATA | | | | |
| | CONTROL DATA | CONTROL DATA | CONTROL DATA | CONTROL DATA | | | | |
| | CONTROL DATA | CONTROL DATA | CONTROL DATA | CONTROL DATA | | | | |
| | CONTROL DATA | CONTROL DATA | CONTROL DATA | CONTROL DATA | | | | |
| #0000 | | | | | | | | |

Phase 0

Phase 1

READ 1

READ 2

READ 3

Fig.19

|        | LOWER BIT | UPPER BIT |     |
|--------|-----------|-----------|-----|
| Y000H  | I/O 0     | I/O 4     | P0  |
|        | I/O 1     | I/O 5     | P1  |
|        | I/O 2     | I/O 6     | P0  |
|        | I/O 3     | I/O 7     | P1  |

⋮

|        | LOWER BIT | UPPER BIT |     |
|--------|-----------|-----------|-----|
| Y7FFH  | I/O 0     | I/O 4     | P0  |
|        | I/O 1     | I/O 5     | P1  |
|        | I/O 2     | I/O 6     | P0  |
|        | I/O 3     | I/O 7     | P1  |
| Y800H  | I/O 0     | I/O 4     | P0  |
|        | I/O 1     | I/O 5     | P1  |
|        | I/O 2     | I/O 6     | P0  |
|        | I/O 3     | I/O 7     | P1  |

⋮

|        | LOWER BIT | UPPER BIT |     |
|--------|-----------|-----------|-----|
| Y83FH  | I/O 0     | I/O 4     | P0  |
|        | I/O 1     | I/O 5     | P1  |
|        | I/O 2     | I/O 6     | P0  |
|        | I/O 3     | I/O 7     | P1  |

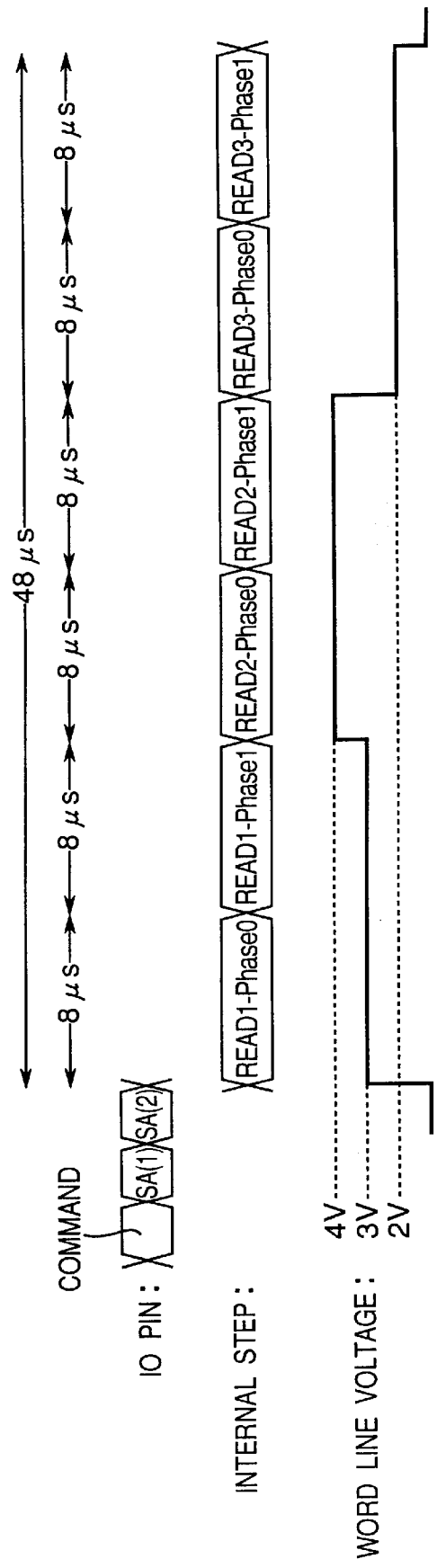

NON-VOLATILE SEMICONDUCTOR MEMORY DEVICE CONFIGURED TO READ DATA AT A HIGH SPEED

BACKGROUND OF THE INVENTION

The present invention relates to an electrically rewritable non-volatile semiconductor memory device and, more particularly, to a flash memory.

An EPROM, which is erasable collectively by ultraviolet, an EEPROM, which is erasable electrically, and a flash memory have been developed in this order as a non-volatile semiconductor memory, and have now become popular. The flash memory excels in high speed serial writing/serial reading, and has a large storage capacity. The mass storage capability in flash memory is progressing at a higher rate than DRAM, because a scale-down in processing rule and a multiple-valued technology (Japanese Laid-open Patent Publication No. 4-119594, Japanese Laid-open Patent Publication No. 10-92186, Japanese Laid-open Patent Publication No. 10-334674) are adopted in the flash memory. Multi-bit data are memorized in a memory cell by the multiple-valued technology.

The multiple-valued technology is explained as following. Generally, one bit data has either "1" or "0" that corresponds to one of two states of a memory cell. According to the multiple-valued technology, for example, in the case of two-bit memory, a memory cell may assume one of four states. In addition, the four states correspond to "11", "10", "00", and "01". Then two-bit data is memorized in a memory cell. Referring to FIG. 15, three reading steps, at which three different word line voltages are applied, are needed to read whole two-bit data in a memory cell.

With regard to flash memory for data storage, the minimum unit of serial writing/serial reading is sector (or page). One section has generally a plurality of memory cells that make an array along a word line for data reading. In this flash memory, one sector includes the control data, which is controlled by controller, and user data. The control data include, for example, a first flag that indicates a bad sector, a second flag that indicates a valid data, data corresponding to writing times in the sector, ECC (Error Correcting Code) data for user data in the sector, etc. Although control data varies with the system used.

In the flash memory, for example, the AND type flash memory with 64 Mbytes, one sector is constructed by data regions of 512 bytes and control regions of 16 bytes. The control data are memorized in the control region. In addition, in the AND type flash memory with 256 Mbytes, one sector is constructed by data regions of 2,048 bytes and control regions of 64 bytes. It takes about 50 usec to read each sector, and it takes about 50 nsec by a byte to transfer data.

It is now made a high-capacity of a memory device by raising memory cell density in the memory device. However, when adjacent memory cells are adjacent to each other, an erroneous reading may happen because interference from the nearby bit line is caused by the capacitance between the adjacent bit lines in the case of reading both adjacent memory cells at the same time. In this case, for example, one reading step may be divided to at least two phases, Phase 0 and Phase 1. It is noted that initial memory cell of memory cell array, which is connected to a word line, is numbered as "0", and the following memory cells are numbered as "1", "2", and "3". In Phase 0, the even-numbered memory cells are read (FIG. 14A). In Phase 1, the odd-numbered memory cells are read (FIG. 14B). Therefore, read error may be prevented because interference from the nearby bit line may be controlled by two phases of reading step.

It is noted that the Japanese Laid-open Patent Publication No. 11-176960 discloses the non-volatile semiconductor memory. The semiconductor memory has a set-up means that makes one bit line of the adjacent two bit lines to pre-charge in pre-charge voltage, and makes it on floating state in NAND cell unit. Then the set-up means makes another bit line in plus charge. However, the semiconductor memory relates to processing to read the certain memory cell.

By the way, in the flash memory, one sector is read together. It may be necessary that the desired data are read as fast as possible. Especially, the control data in memory cell of a sector are needed in the controller initially, so that it is necessary to read the control data at a high speed.

Referring to FIG. 18, in logical layout, for example, a sector has a data region (Y000H–Y7FFH) and a control region (Y800H–Y83FH). FIG. 19 shows the physical layout of memory cell array of a sector. Referring to FIG. 19, however, when the all data are read by two phases (Phase 0, Phase 1), it is necessary that two phases have been performed in order to read even the control data. Therefore, referring to FIG. 20, the data of data region must be read in order to read the control data. Then it takes time of reading one sector to read the control data.

SUMMARY OF THE INVENTION

Therefore, it is an object of the present invention to provide a electrically rewritable non-volatile semiconductor memory device, in which the certain data, for example, the control data may be read at a high speed.

In accordance with one aspect of the present invention, there is provided a non-volatile semiconductor memory device including a plurality of word lines, a plurality of bit lines, a plurality of memory cells, and a reading means. A plurality of bits are memorized at each memory cell. The plurality of bit lines lie at right angle to the word lines. The reading means is configured to read certain data from every (n−1)th (n is an integer that is greater than two) memory cell of a memory cell array connecting to at least a word line. The memory cell exists on the point of intersection with the word line and the bit line. Then data reading and data writing are made by applying the voltage on the word line and the bit line. The non-volatile semiconductor memory device is electrically rewritable.

In another aspect of the present invention, the non-volatile semiconductor memory device may further include a writing means. The writing means can write the certain data into every (n−1)th (n is an integer that is greater than two) memory cell of a memory cell array that is connecting to at least a word line.

In a further aspect of the present invention, there is provided a non-volatile semiconductor memory device including a plurality of word lines, a plurality of bit lines, a plurality of memory cells, and a reading means. A plurality of bits are memorized at each memory cell. The plurality of bit lines lie at right angle to the word lines. The reading means is configured to read certain data from at least one predetermined bit of the plurality of bits corresponding to at least one memory cell of a memory cell array that is connecting to at least a word line. The memory cell exists on the point of intersection with the word line and the bit line. Then data reading and data writing are made by applying the voltage on the word line and the bit line. The non-volatile semiconductor memory device is electrically rewritable.

In another aspect of the present invention, the non-volatile semiconductor memory device may further include a writing means. The writing means is configured to write certain data into said at least one predetermined bit of a certain memory cell of a memory cell array that is connecting to at least a word line.

In a further aspect of the present invention, there is provided a non-volatile semiconductor memory device including a plurality of word lines, a plurality of bit lines, a plurality of memory cells, and a reading means. A plurality of bits are memorized at each memory cell. The plurality of bit lines lie at right angle to the word lines. The reading means can read certain data from at least one predetermined bit of every (n−1)th (n is an integer that is greater than two) memory cell of a memory cell array that is connecting to at least a word line. The memory cell exists on the point of intersection with the word line and the bit line. Then data reading and data writing are made by applying the voltage on the word line and the bit line. The non-volatile semiconductor memory device is electrically rewritable.

In a still further aspect of the present invention, the non-volatile semiconductor memory device may include a writing means. The writing means can write certain data into at least one predetermined bit of every (n−1)th (n is an integer that is greater than two) memory cell of a memory cell array that is connecting to at least a word line.

In a yet further aspect of the present invention, the certain data are read from certain memory cell by the reading means based on a command. The command specifies the starting memory cell and the command is inputted from outside.

In a yet further aspect of the present invention, the certain data are control data regarding to the memory cell array that is connecting to at least a word line.

In a yet further aspect of the present invention, there is provided a system including the non-volatile semiconductor memory device. The data input/output process is performed by the non-volatile semiconductor memory device.

According to the non-volatile semiconductor memory device of this invention, the memory device has a reading means. The reading means can read the certain data from every (n−1)th (n is an integer, which is more than two) memory cell, for example, from the even-numbered memory cell in the case of n=3 by Phase 0. Therefore, it may take half time of reading one sector to read the certain data.

According to the non-volatile semiconductor memory device of this invention, the memory device has writing means. The writing means can write the certain data in every (n−1)th (n is an integer, which is more than two) memory cell, for example, in even-numbered memory cell in the case of n=3 by Phase 0. Therefore, it may take half time of reading one sector to read the certain data.

According to the non-volatile semiconductor memory device of this invention, the memory device has reading means. The reading means can read the certain data from upper bit of the predetermined memory cell, for example, in upper bit of the predetermined memory cell in the case of two-bit memory by READ 1. Then, for example, regarding with two-bit memory, the certain data may be read by only first reading step of three reading steps, which are needed to decide whole two-bit data. Therefore, it may take one-third time of reading one sector to read the certain data. Moreover, regarding with three-bit memory, the certain data may be read by only first reading step of seven reading steps, which are needed to decide whole three-bit data. Therefore, it may take one-seventh time of reading one sector to read the certain data.

According to the non-volatile semiconductor memory device of this invention, the memory device has writing means. The writing means can write the certain data in upper bit of the predetermined memory cell. Therefore, the certain data may be memorized in upper bit of the predetermined memory cell.

In addition, for example, in regard to the memory, the certain data may be read by only first reading step of three reading steps, which are needed to decide whole two-bit data. Therefore, it may take one-third time of reading one sector to read the certain data. Moreover, regarding with three-bit memory, the certain data may be read by only first reading step of seven reading steps, which are needed to decide whole three-bit data. Therefore, it may take one-seventh time of reading one sector to read the certain data.

According to the non-volatile semiconductor memory device of this invention, the memory device has reading means. The reading means can read the certain data from upper bit of every (n−1)th (n is an integer that is more than two) memory cell, for example, from upper bit of even-numbered memory cell in the case of n=3. Then the certain data may be read by Phase 0 of READ 1. Therefore, regarding with two-bit memory, it may take one-sixth time of reading one sector to read the certain data.

According to the non-volatile semiconductor memory device of this invention, the memory device has writing means. The writing means can write the certain data in upper bit of every (n−1)th (n is an integer that is more than two) memory cell, for example, in upper bit of even-numbered memory cell in the case of n=3. Therefore, the certain data may be memorized in upper bit of every memory cell. In addition, the memory device has reading means, which can read the certain data by Phase 0 of READ 1. Therefore, regarding with two-bit memory, it may take one-sixth time of reading one sector to read the certain data.

According to the non-volatile semiconductor memory device of this invention, the address of the memory cell for reading the certain data may be changed by inputted command.

According to the non-volatile semiconductor memory device of this invention, the control data, which is needed for controller initially, may be read at high speed.

According to the data memory system of this invention, data input/output with outside may be performed by the non-volatile semiconductor memory device. Therefore, the certain data, for example, the control data may be read at high speed.

BRIEF DESCRIPTION OF THE DRAWINGS

FIG. 2 shows a physical layout regarding to one sector of the non-volatile semiconductor memory device of the first embodiment of the invention;

FIG. 4 shows a physical layout regarding to one sector of the non-volatile semiconductor memory device of a second embodiment of the invention;

FIG. 6 shows a physical layout regarding to one sector of the non-volatile semiconductor memory device of a third embodiment of the invention;

FIG. 8 shows a physical layout regarding to one sector of the non-volatile semiconductor memory device of a fifth embodiment of the invention;

FIG. 9 shows a reading step, at which a control data with one sector is read on the non-volatile semiconductor memory device of a fourth embodiment of the invention;

FIG. 12 shows a physical layout regarding to one sector of the data memory system of the sixth embodiment of the invention;

FIG. 13 shows other physical layout regarding to one sector of the data memory system of the sixth embodiment of the invention;

FIG. 19 shows a physical layout regarding to one sector of the non-volatile semiconductor memory device; and FIG. 20 shows reading step, at which a control data with one sector is read on the non-volatile semiconductor memory device of FIG. 19.

DETAILED DESCRIPTION OF THE PREFERRED EMBODIMENTS

Figure 1:
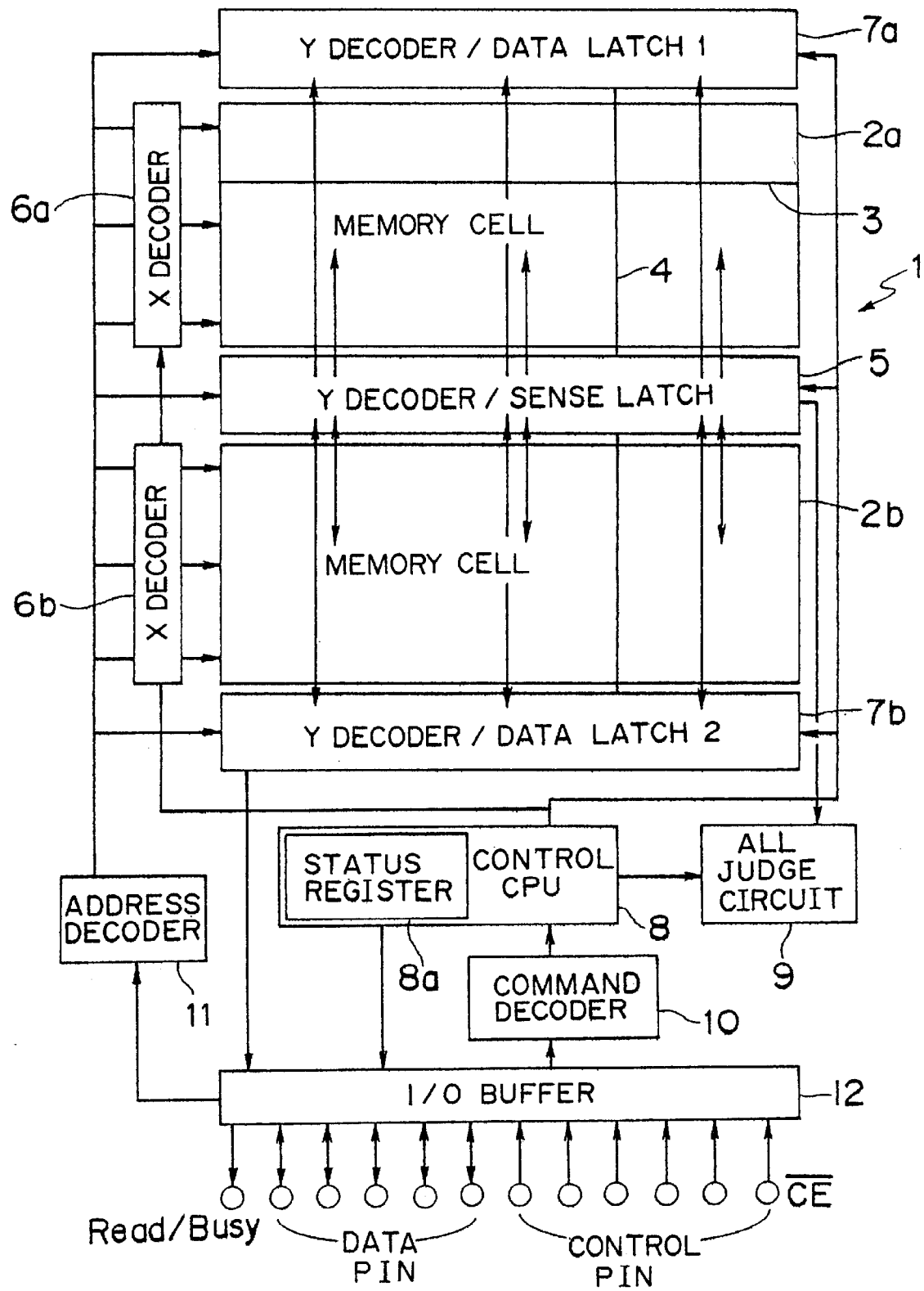
FIG. 1 is a schematic drawing of a non-volatile semiconductor memory device of a first embodiment of the invention.

Referring to FIG. 1, a non-volatile semiconductor memory cell device 1 includes a plurality of memory cells 2a, 2b; a Y decoder/sense latch 5 positional between memory cell 2a and 2b; a Y decoder/data latch 7a positional above memory cell 2a, a Y decoder/data latch 7b positioned below the memory cell 2b; and a X decoder 6a, 6b. Then, there are a plurality of word lines 3 and a plurality of bit lines 4 that each lie at a right angle to each of the plurality of word lines 3. Each memory cell 2a, 2b exists on the point of intersection with a word line 3 and a bit line 4. The memory cell 2a makes an array along a word line 3, which elongates from X decoder 6a. The memory cell 2a is connected to Y decoder/sense latch 5 and Y decoder/data latch 7a by the bit lines 4, and is connected to Y decoder/data latch 7b by the bit lines 4.

The reading step of this non-volatile semiconductor memory device 1 is explained as follows. The sector, that is a unit of reading step, is a memory cell array including a plurality of memory cells 2a, 2b each connected to a word line 3. When reading from a memory cell array, the data is read from every other memory cell by one phase. Therefore, there is two phases, for example, Phase 0 and Phase 1, in the reading step. Specifically, each even-numbered memory cell is read in Phase 0, and each odd-numbered memory cell is read in Phase 1. When reading from two-bit data that are memorized in a memory cell, there are three reading steps, for example READ 1, READ 2, and READ 3. The data read is transferred from the bit line 4 to the sense latch 5 in each reading step. The upper bits are outputted from data latch 7b, and the lower bits are outputted from data latch 7a. The upper bit can be decided in READ 1.

It is noted that the reading step is not limited to just two phases, but n (n is an integer that is greater than one) phases, in which the data is read from every (n−1)th memory cells.

This non-volatile semiconductor memory device 1 includes a control CPU 8, ALL judge circuit 9, command decoder 10, address decoder 11, and I/0 buffer 12. The data input and data output externally are performed through the I/O buffer 12 in this memory device 1. The input data is written, and memorized into the memory cell 2a, 2b according to a predetermined address by address decoder 11. The result of writing step is judged by ALL judge circuit 9. Input command is decoded by the command decoder 10. The CPU 8 controls data reading and data writing with memory cell by the input command.

Figure 16A:
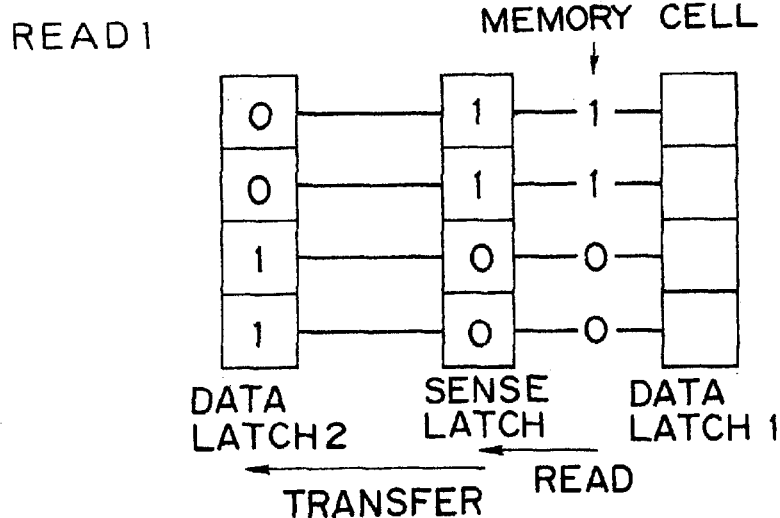
FIG. 16A shows a change in sense latch value and data latch value at READ 1 step, at which two bit data is read from a memory cell.

Assume that there are four memory cells with different statuses, which layout along a word line (FIG. 16A). The four memory cells, which have different threshold voltages, layout in descending order of the threshold voltage. In this case, two bit memory is read from each memory cell.

In READ 1, the reading step is performed by applying 3.0 V on the word line (FIG. 16A). If the memory cell has a lower threshold voltage than the word line voltage (3.0V), the current flows through the memory cell, so "0" is latched in the sense latch. Then, if the memory cell has a higher threshold voltage than the word line voltage (3.0V), the current cannot flow through the memory cell, so "1" is latched in the sense latch. The latched value is transferred from sense latch to the data latch 2. In the data latch 2, the transferred value is inverted in output side, that is opposite side to sense latch. The inverted values are "0", "0", "1", and "1", which correspond to the upper bit of the two bits, in descending order (FIG. 16A).

Figure 16B:
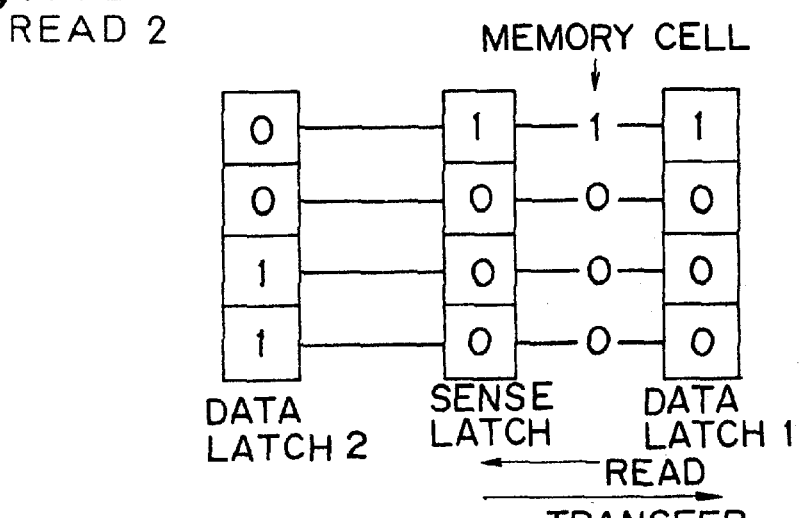
FIG. 16B shows a change in sense latch value and data latch value at READ 2 step, at which two bit data is read from a memory cell.

In READ 2, the reading step is performed by applying 4.0 V on the word line (FIG. 16B). There are three memory cells, which have lower threshold voltage than the word line voltage (4.0V). The current flows through these three memory cells, so that "0" is latched in sense latch. The current cannot flow through the memory cell, which has highest threshold voltage, so that "1" is latched in sense latch. Then the latched value is transferred from sense latch to data latch 1.

Figure 16C:
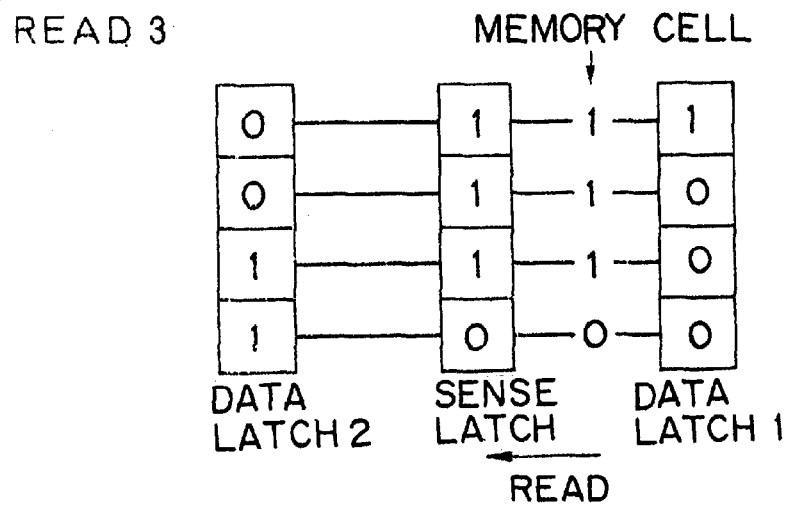
FIG. 16C shows a change in sense latch value and data latch value at READ 3 step, at which two bit data is read from a memory cell.

In READ 3, reading step is performed by applying 2.0 V on the word line (FIG. 16C). The current flows through a memory cell, which has the lowest threshold voltage, so that "0" is latched in sense latch. There are three memory cells, which has a higher threshold voltage than the word line voltage (2.0 V). The current cannot flow through the three memory cells, so that "1" is latched in sense latch.

Figure 17A:
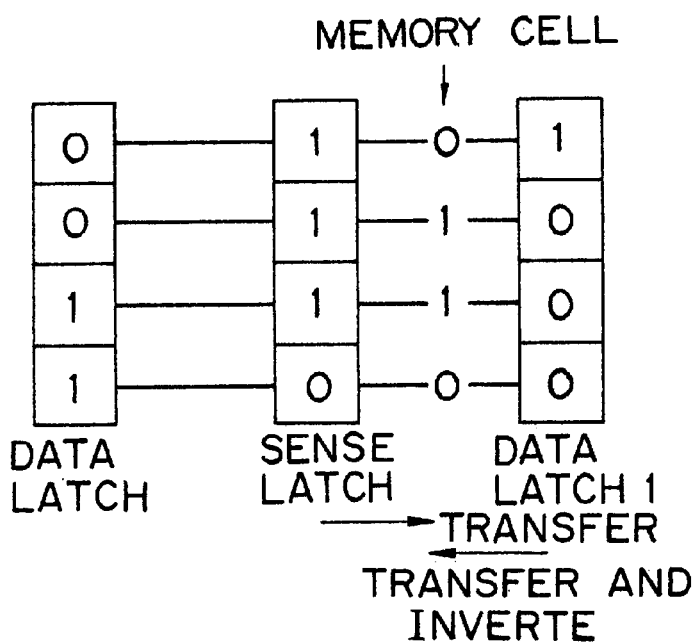
FIG. 17A shows the schematic XOR operation, by which the lower bit are decided after READ 3 step of FIG. 16C.
Figure 17B:
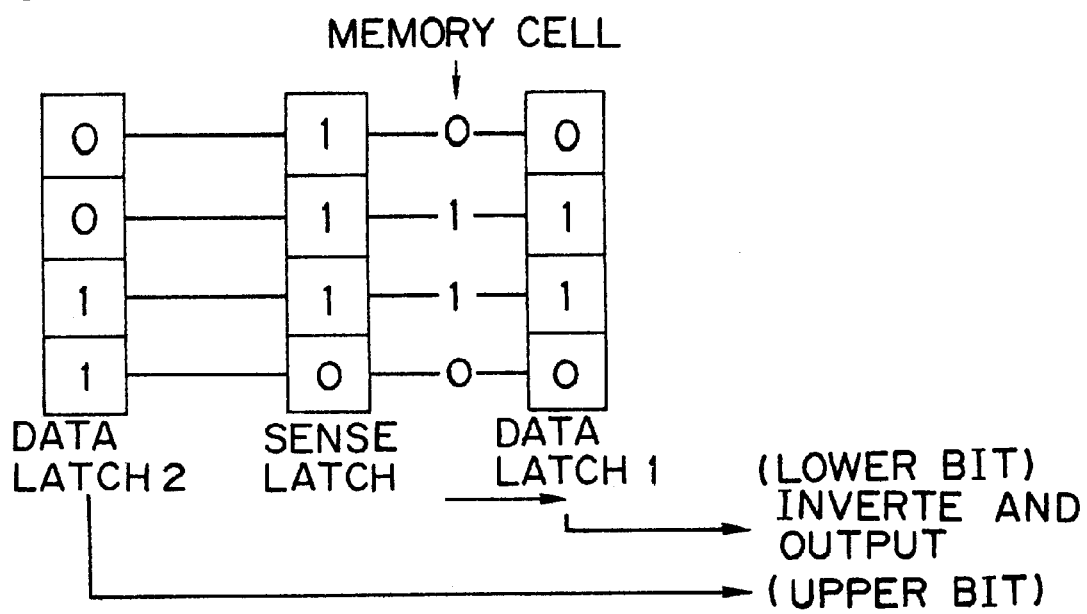
FIG. 17B shows a correspondence between output of each data latch and two bit data about upper bit and lower bit.
Figure 18:
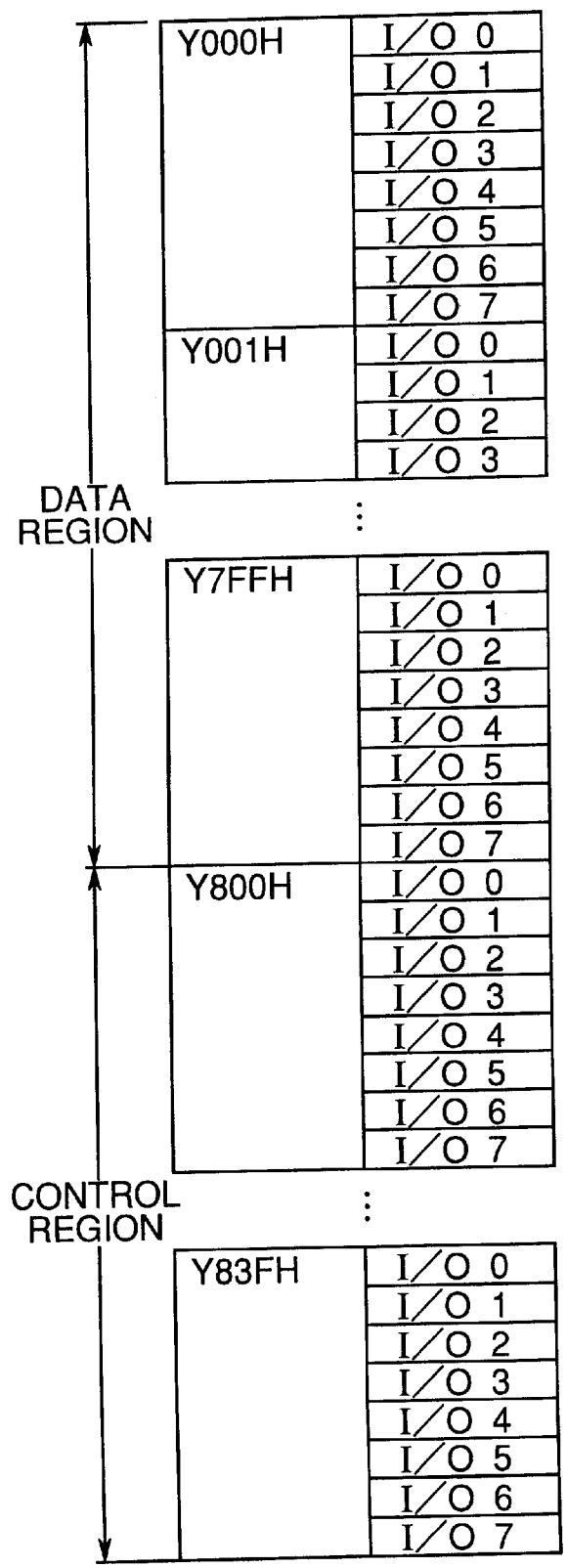
FIG. 18 shows a logical layout regarding to one sector of the non-volatile semiconductor memory device.

Referring to FIG. 17A, the latches value ("1", "1", "1", and "0") in READ 3 is transferred from sense latch to bit lines. The latched value ("1", "0", "0", and "0") in data latch 1 are inverted ("0", "1", "1", and "1"), and transferred to bit lines. The XOR operate between the latched value ("1", "1", "1", and "0") in READ 3 and the inverted value ("0", "1", "1", and "1") is performed. Then, results of the XOR operation ("0", "1", "1", and "0") are latched in data latch 1. The latched data are inverted, and the inverted data ("1", "0", "0", and "1") are outputted from the data latch 1. The data correspond to the lower bit data of two-bit memory. Both the lower bit data and the upper bit data (in data latch 2) are outputted (FIG. 17B). When the upper bit and lower bit are placed side by side, there are "01", "00", "10", and "11", which correspond to the four states of memory cells. Therefore, the two-bit memory are read from each memory cell by three reading step (READ 1, READ 2, READ 3).

FIG. 2 shows a physical layout of one sector of the non-volatile semiconductors memory device 1. In FIG. 2, it is conveniently shown that memory cell array, in which each memory cell are lied along word line, is lined up. In FIG. 2, each column corresponds to logical address of lower bit and upper bit of a memory cell. For example, the control data (Y800H I/O 0–Y83FH I/O 7) is memorized in even-numbered memory cells (P0) from determined memory cell.

It is noted that the Y800H corresponds to the logical address, and Y is a Y direction, 800H is a hexadecimal numeral (2048 in decimal numeral) representative of the number of bytes. The I/O 0 corresponds to I/O pin number 0. There are eight I/O pins number 0–7 that transfer eight bits (1 byte). Nevertheless, not limited to this numeral, several numerals may be used.

Figure 3:
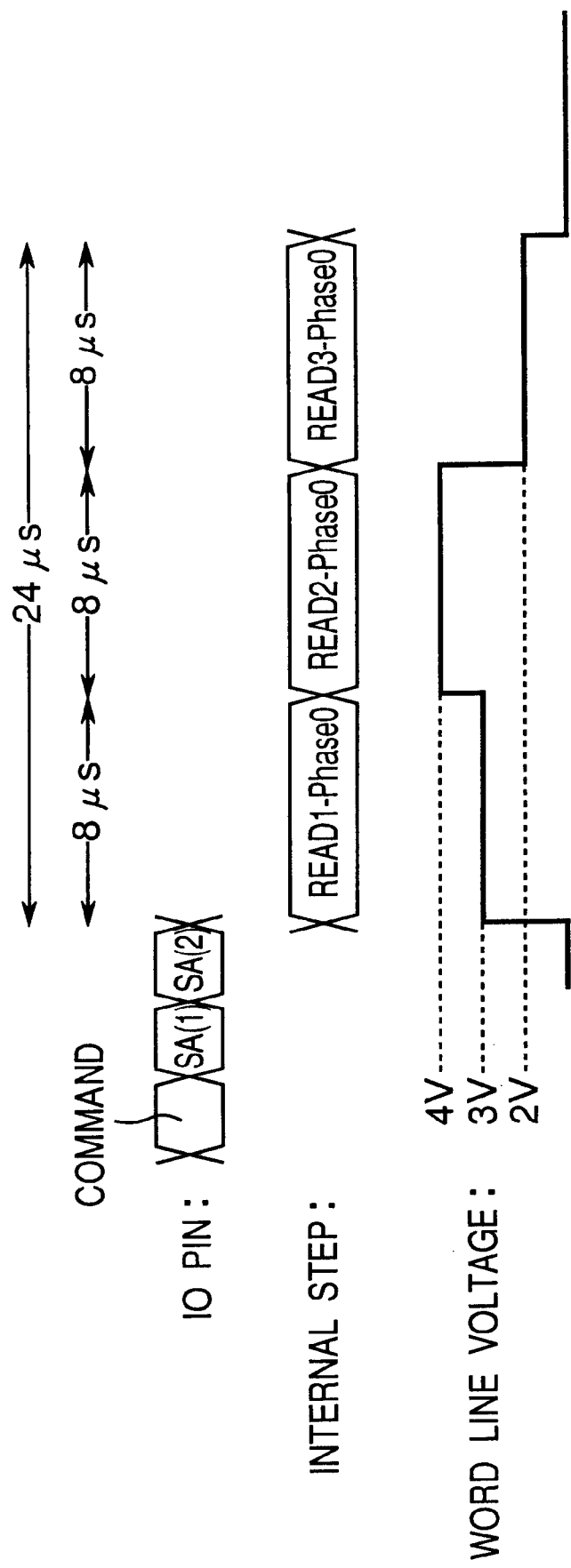
FIG. 3 shows a reading step, at which a control data with one sector is read on the non-volatile semiconductor memory device of the first embodiment of the invention.

FIG. 3 shows reading step, at which a control data with one sector is read on a non-volatile semiconductor memory device of the first embodiment of the invention. In this reading step, initially, command, address of upper bit (SA (1)), and address of lower bit (SA(2)) are inputted in this order. Then, the word line that is desired to read is decided, and serial reading step is performed. In reading step, only Phase 0 (P0) of READ 1, READ 2, and READ 3 are performed. The control data can be read by only Phase 0 because the control data are memorized in the even-numbered memory cell (P0). Therefore, the reading time for control data is 24 usec that is half of reading time for one sector.

FIG. 4 shows physical layout regarding to one sector of the non-volatile semiconductor memory device of a second embodiment of the invention. The non-volatile semiconductor memory device differs from the non-volatile semiconductor memory device of the first embodiment in that the control data are memorized in upper bit of the two-bit memory. In this memory device, the control data may be read preferentially from a memory cell, in which multi-bits are memorized by multi-valued technology.

The subject for reading from a memory cell with multi-valued technology is explained as follows. Multi-bit data are memorized in a memory cell by multi-valued technology, so that three reading steps are needed for reading from a memory cell with two-bit data (four values). In addition, seven reading steps are needed for reading from a memory cell with three-bit data (eight values). In the case of two-bit memory, two bit data in a memory cell are not decided without three reading steps. In one reading step, all memory cells in one sector, which include other memory cell with no control data, are read in serial order. Therefore, it is necessary that the extra memory cells are read in order to read the desired control data. Then, reading time with control data needs time of reading one sector.

The Japanese Laid-open Patent Publication No. 10-11982, and No. 10-11979 disclose the non-volatile semiconductor memory device that has memory cells with multi-bit data. The multi-bit data has higher bit and lower bit. Data in either upper bit or lower bit is read and outputted, and during the outputting another bit data is read in this memory device. The Japanese Laid-open Patent Publication No. 10-334674 discloses the semi-conductor memory that has read initially head bit of bit data array, in which a lot of bit data are laid out. However, on the non-volatile semiconductor memory device of the Japanese Laid-open Patent Publications No. 10-11982, and No. 10-11979 and the semi-conductor memory of the Japanese Laid-open Patent Publication No. 10-334674, serial access is performed without a gap, but the reading the control data from control region is not given preference.

Figure 5:
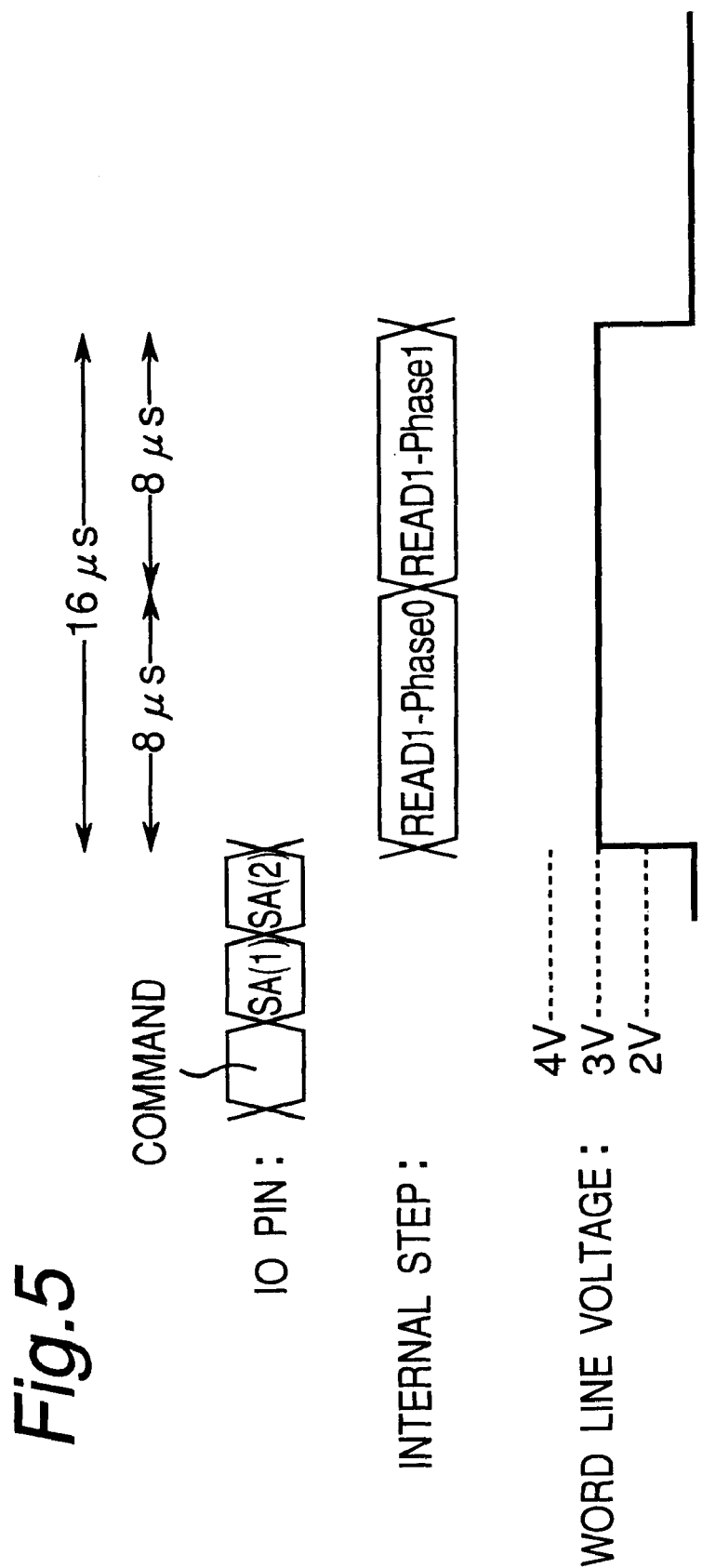
FIG. 5 shows a reading step, at which a control data with one sector is read on the non-volatile semiconductor memory device of the second embodiment of the invention.

The non-volatile semiconductor memory device of the second embodiment of the present invention may resolve the problem of highly reading from memory cell with the multi-valued technology. Referring to FIG. 3 illustrating a sector in the non-volatile semiconductor memory device, for example, the control data in Y800H I/O 0–I/O 7 are memorized in upper bit of series memory cells. FIG. 5 shows reading step, at which the control data have been read. At the reading step, both Phase 0 and Phase 1 of READ 1 are performed. The control data (Y800H I/O 0–Y83FH I/O 7) are only memorized in upper bit of each memory cell, so that the control data can be read by READ 1. Therefore, it may take one-third time of reading one sector to read the control data. It is noted that the control data can be read by the first reading step of the seventh reading step, which are needed to decide all bit data of a memory cell with three-bit memory. Therefore, it may take one-seventh time of reading one sector to read the control data.

Figure 7:
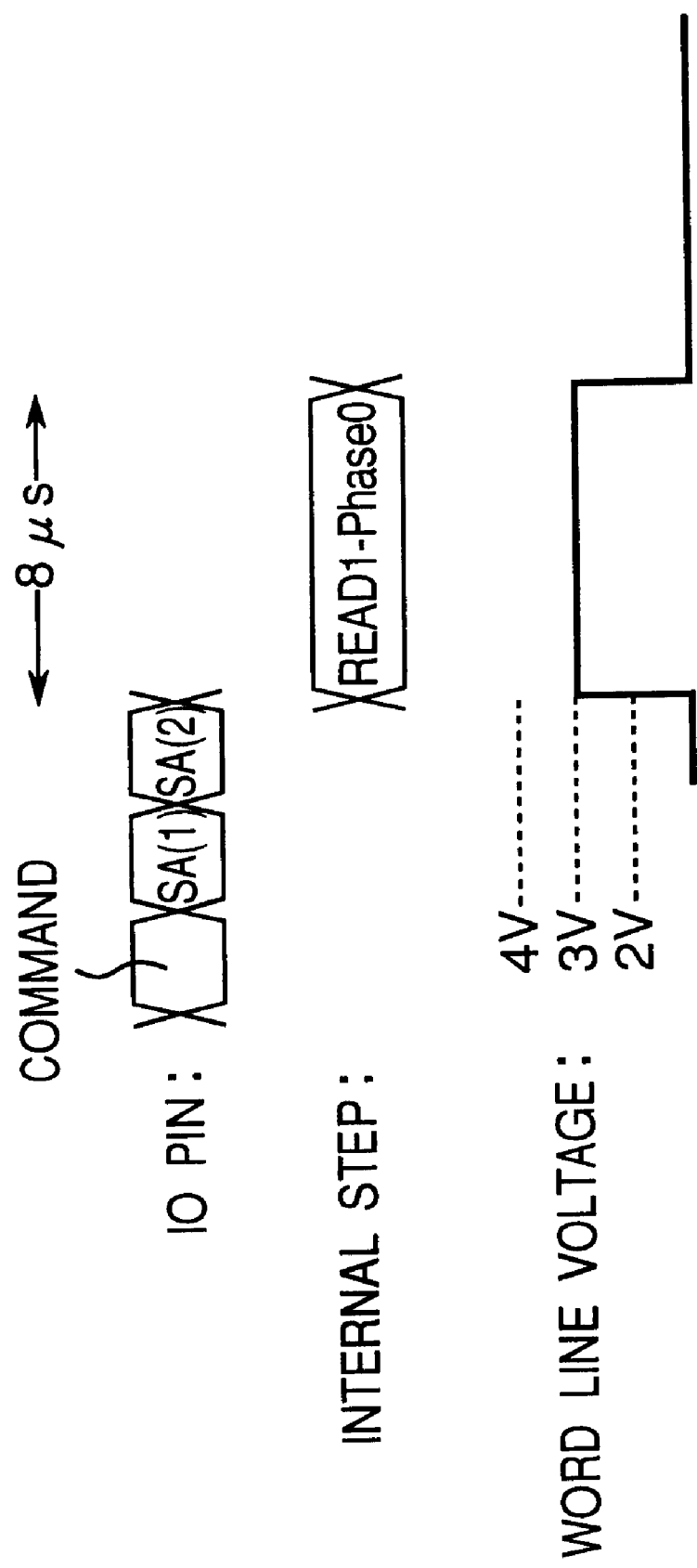
FIG. 7 shows a reading step, at which a control data with one sector is read on the non-volatile semiconductor memory device of a third embodiment of the invention.

FIG. 6 shows physical layout of one sector of the non-volatile semiconductor memory device of a third embodiment of the invention. The non-volatile semiconductor memory device differs from the non-volatile semiconductor memory device of the first and second embodiments in that the control data are memorized in upper bit of two-bit memory in every memory cell from predetermined memory cell. In FIG. 6, for example, the control data (Y800H I/O 0–I/O 3) are memorized in upper bit of even-numbered memory cell. FIG. 7 shows the reading steps at which the control data have been read. The control data are only memorized in upper bit of every memory cell, so that the control data can be read by Phase 0 of READ 1. Therefore, it may take one-sixth time of reading one sector to read the control data.

FIG. 8 shows physical layout of one sector of the non-volatile semiconductor memory device of a forth embodiment of the invention. The non-volatile semiconductor memory device differs from the non-volatile semiconductor memory device of the second embodiment in that the certain data, which is oversize above the control data size, are memorized in upper bit of two-bit memory in predetermined memory cell. In FIG. 8, for example, the control data (Y000H I/O 0–Y41FY I/O 7) are memorized in upper bit. It is noted that the maximum data size of the certain data size is 1,056 bytes, which is half of one sector capacity. FIG. 9 shows reading step, at which the control data have been read. The certain data are memorized in upper bit of the predetermined memory cell, so that the control data can be read by Phase 0 and Phase 1 of READ 1 in this order. Therefore, it may take one-third time of reading one sector to read the control data.

If the certain data are memorized in upper bit of even-numbered memory cell (P0), the certain data can be read by Phase 0 of READ 1. Therefore, it may take one-sixth time of reading one sector to read the control data. It is noted that the maximum data size of the certain data is 528 bytes, which is quarter of one sector capacity.

The physical layout regarding to one sector of the non-volatile semiconductor memory device of a fifth embodiment of the invention is similar to the non-volatile semiconductor memory device of fifth embodiment of the invention in FIG. 8. The certain data (Y210H–Y41FH, Y630H–Y83FH) are memorized in upper bit of the odd-numbered memory cell. Generally, at the reading step Phase 0 and Phase 1 are performed in this order. However, initial reading order is changed by input address in this non-volatile semiconductor memory cell. In this case, if the addresses (Y210H–Y41FH, Y630H–Y83FH) are inputted, the odd-numbered memory cell are read by Phase 1. Therefore, the odd-numbered memory cell can be read at a high speed. It is noted that the maximum data size of the certain data is 1,056 bytes, which is half of one sector capacity.

Figure 10:
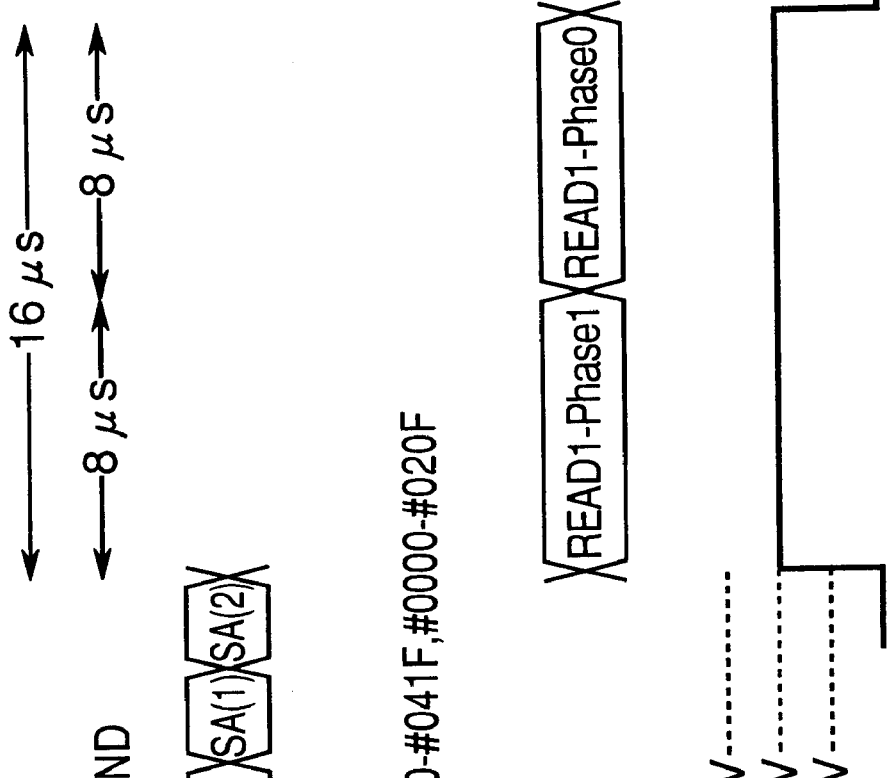
FIG. 10 shows a reading step, at which a control data with one sector is read on the non-volatile semiconductor memory device of a fifth embodiment of the invention.

FIG. 10 shows the reading step, at which the certain data have been read. The certain data are memorized in upper bit of odd-numbered memory cell. In this case, if the addresses (Y210H–Y41FH) are inputted, the upper bit of the odd-numbered memory cell are read by Phase 1 of READ 1. Therefore, the upper bit of the odd-numbered memory cell can be read at a high speed by inputted address or command from outside. It is noted that the maximum data size of the certain data is 528 bytes, which is a quarter of one sector capacity.

Phase 1 may be performed by command from outside. Then the certain data may be memorized in upper bit. It is noted that the upper bit can be decided by READ 1 so that the maximum data size of the certain data is half of one sector capacity.

Figure 11:
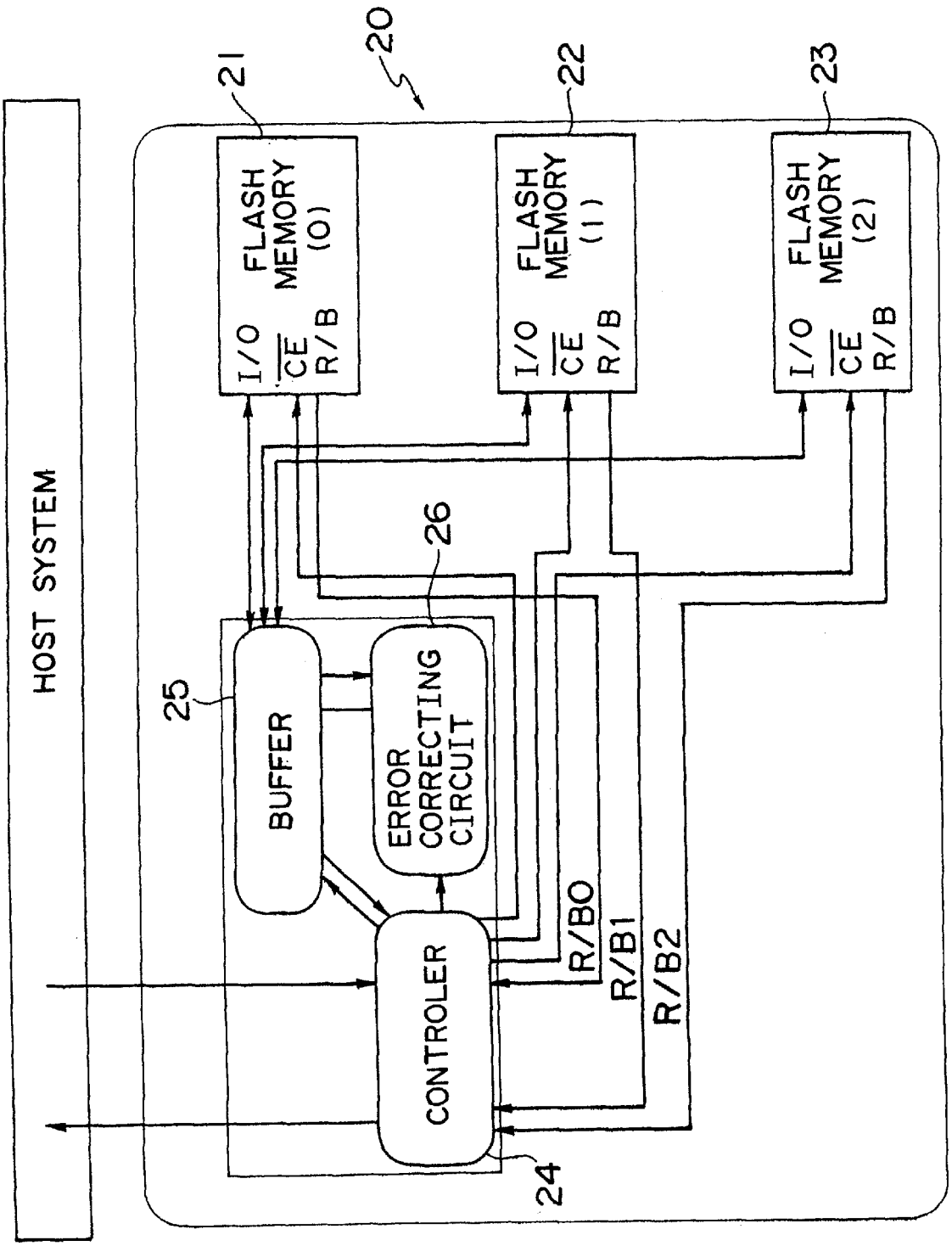
FIG. 11 is a schematic drawing of a data memory system of a sixth embodiment of the invention.
Figure 14A:
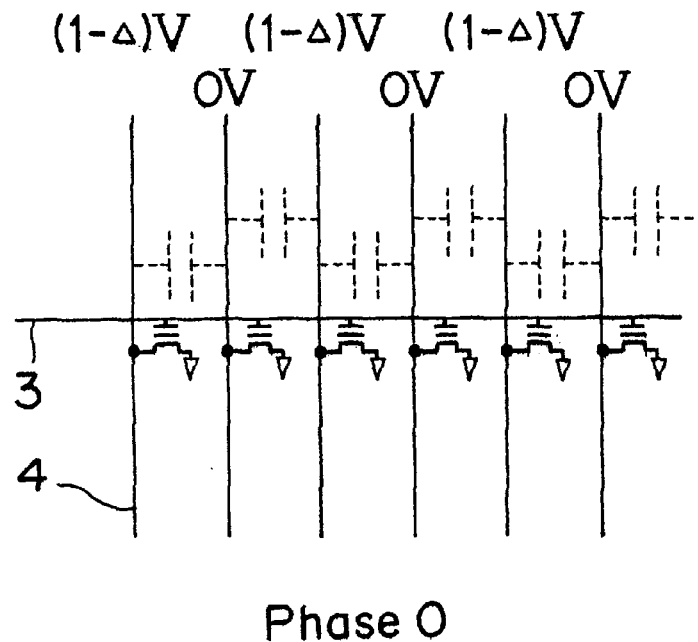
FIG. 14A shows an applied voltage condition on bit line at Phase 0, when adjacent two memory cells that make an array along word line of a flash memory are read.
Figure 14B:
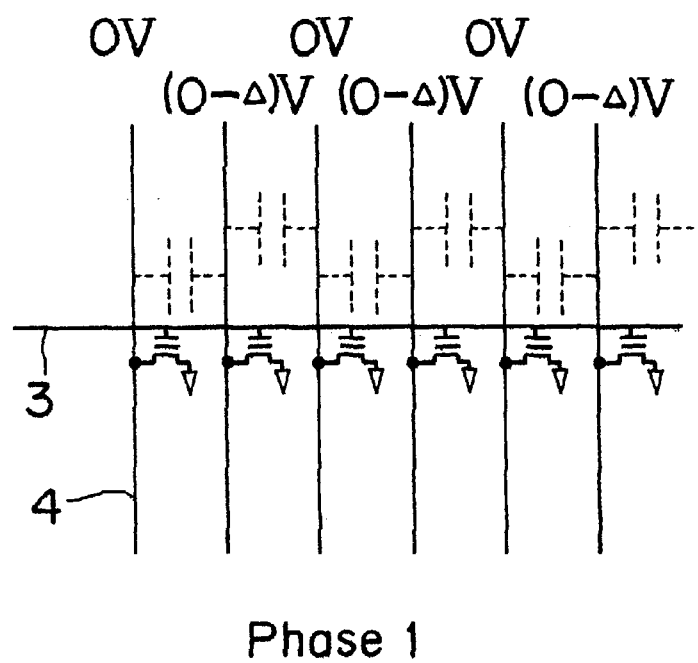
FIG. 14B shows an applied voltage condition on bit line at Phase 1, when adjacent two memory cells that make an array along word line of the flash memory are read.
Figure 15:
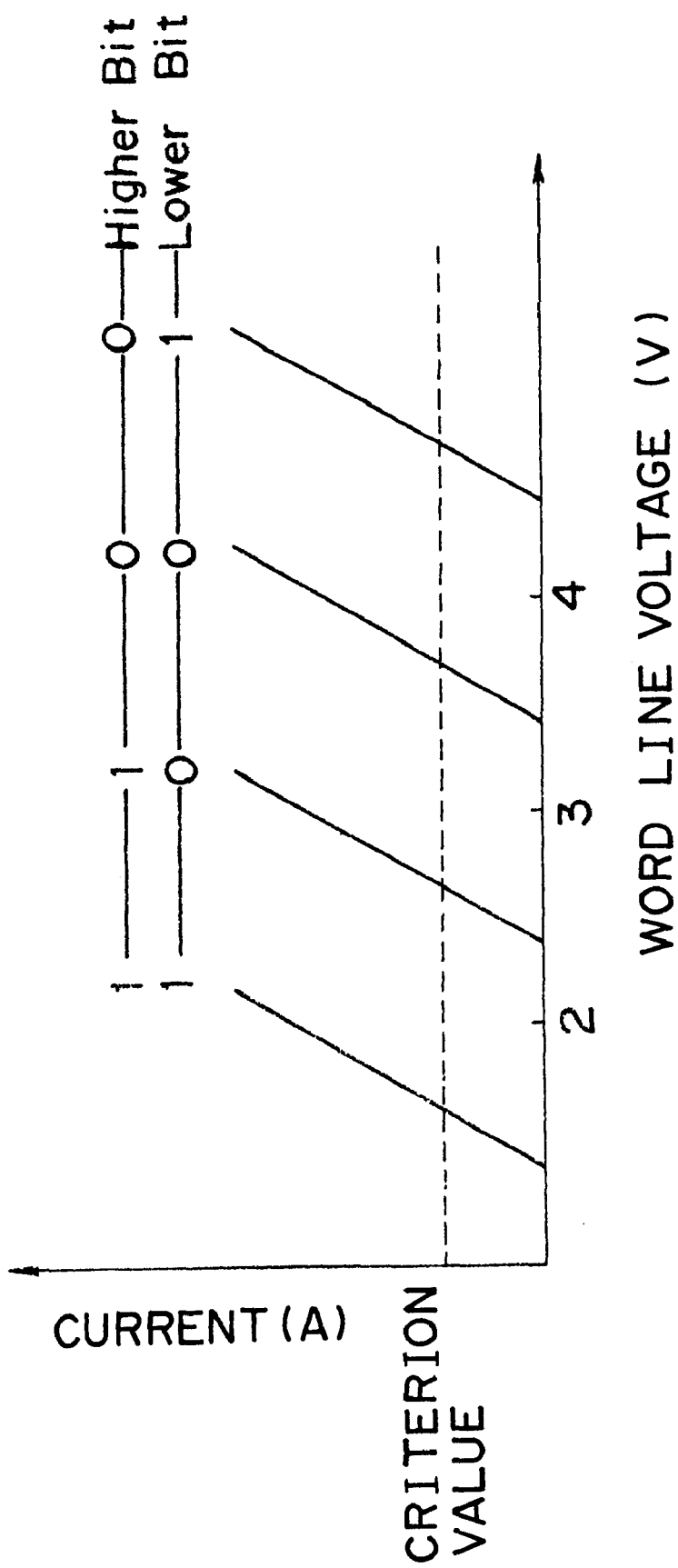
FIG. 15 shows combinations about upper bit and lower bit regarding to four states, at which the applied voltage and flowing current relate, when two bit data is read.

FIG. 11 is a schematic drawing of a data memory system of a sixth embodiment of the invention. The non-volatile semiconductor memory cell above mentioned may be used in this data memory system. Actually, the non-volatile semiconductor memory cell of the first-to-fifth embodiments of the invention may be used in this data memory system. Referring to FIG. 11, this data memory system 20 includes three flash memories 21, 22, 23, controller 24, which controls the flash memory, buffer 25, which memory data temporarily, and error correcting circuit 26. The control data are frequently accessed by controller 24 for system use. In the data memory system 20, the control data are memorized in the control region of one sector (FIG. 12).

Data memorizing manner in the first to fifth embodiments may be used in the data memory system. The control data may be memorized in every memory cell that is connected to a word line 3. That is to say, on reading about a memory cell array that is connected to a word line 3, the data may be read from every other memory cell by one phase, for example, Phase 0. In addition, the control data may be memorized in upper bit of the predetermined memory cell, the control data may be read by READ 1. Further, the control data may be memorized in upper bit of every memory cell, the control data may be read by Phase 0 of READ 1.

It is noted that the address of physical layout, in which the data are memorized, may be changed in order to deal with the large data that is over capacity of control region (64 bytes) at a high speed. Referring to FIG. 13, for example, the data (#0000–#041F), which is frequently needed to controller, may be memorized in upper bit of even-numbered memory cell (P0) with a sector. Therefore, the data may be read at a high speed by Phase 0 of READ 1.

If only Phase 0 has been performed at the reading step, it may take half time of reading one sector to read the data, which doesn't have more than half volume of one sector. Moreover, regarding with two-bit memory, when the data are memorized in upper bit of even-numbered memory cell, it may take one-sixth time of reading one sector to read the data, which doesn't have more than quarter volume of one sector. The data memory system may be an IC card.

The data memory system, in which the non-volatile semi-conductor memory device of the invention is used, is not limited to that above mentioned. The data memory system may further include a controller 24, a buffer 25, a control component that contains an error correcting circuit 26, input/output device, for example, keyboard and pointing device, picture input/output device, sound input/output device, and connecting device to connect other device.

What is claimed is:

1. A non-volatile semiconductor memory device comprising:
    a plurality of word lines;
    a plurality of bit lines each provided at a right angle to each of said plurality of word lines forming a plurality of intersection points;
    a plurality of memory cells each corresponding to each of said plurality of intersection points and each having a plurality of bits memorized; and
    a reading means configured to read certain data from every (n−1)th memory cell connected to a selected word line of said plurality of word lines wherein n is an integer that is greater than two (2);
    wherein a data read operation and a data write operation are performed by applying a voltage on said word line and said bit line.

2. The non-volatile semiconductor memory device according to claim 1, further comprising:
    a writing means configured to write said certain data into every (n−1)th memory cell connected to a selected word line of said plurality of word lines.

3. The non-volatile semiconductor memory device according to claim 1 wherein said reading means is further configured to read said certain data from at least one predetermined bit of said plurality of bits corresponding to every said (n−1)th memory cell.

4. The non-volatile semiconductor memory device according to claim 3, further comprising:
    a writing means configured to write said certain data into said predetermined bit of every said (n−1)th memory cell.

5. The non-volatile semiconductor memory device according to claim 1, wherein said certain data is read from said every (n−1)th memory cell based on a command externally supplied to said memory device specifying a starting memory cell of said plurality of memory cells.

6. The non-volatile semiconductor memory device according to claim 1, wherein said certain data is control data corresponding to every memory cell connected to a selected word line of said plurality of word lines.

7. The non-volatile semiconductor memory device according to claim 1 wherein said reading means is configured to read said certain data during a first phase and to read data other than said certain data during at least a second phase different from the first phase.

8. The non-volatile semiconductor memory device according to claim 7 wherein said first phase corresponds to reading every said (n−1)th memory cell.

9. The non-volatile semiconductor memory device according to claim 3, wherein said reading means is configured to read said plurality of bits in a plurality of phases each of which include a plurality of reading steps.

10. The non-volatile semiconductor memory device according to claim 9 wherein said reading means is configured to read said certain data during a first phase and a first reading step of said plurality of phases and said plurality of reading steps, respectively, wherein data other than said certain data is read during any remaining phases and reading steps of said plurality of phases and said plurality of reading steps, respectively.

11. The non-volatile semiconductor memory device according to claim 10 wherein said first phase corresponds to reading every said (n−1)th memory cell.

12. The non-volatile semiconductor memory device according to claim 10 wherein said first reading step corresponds to reading said predetermined bit.

13. A non-volatile semiconductor memory device comprising:

a plurality of word lines;

a plurality of bit lines each provided at a right angle to each of said plurality of word lines forming a plurality of intersection points;

a plurality of memory cells each corresponding to each of said plurality of intersection points and each having a plurality of bits memorized; and a reading means configured to read certain data from at least one predetermined bit of said plurality of bits corresponding to at least one memory cell of said plurality of memory cells connected to a selected word line of said plurality of word lines;

wherein a data read operation and a data write operation are performed by applying a voltage on said word line and said bit line.

14. The non-volatile semiconductor memory device according to claim 3, further comprising:

a writing means configured to write said certain data into said at least one predetermined bit corresponding to at least one memory cell connected to a selected word line of said plurality of word lines.

15. The non-volatile semiconductor memory device according to claim 13 wherein said reading means is configured to read said plurality of bits memorized in a plurality of reading steps wherein each of said plurality of bits read corresponds to at least one of said reading steps.

16. The non-volatile semiconductor memory device according to claim 5, wherein said reading means is configured to read said certain data during at least one of said plurality of reading steps.

* * * * *

UNITED STATES PATENT AND TRADEMARK OFFICE
CERTIFICATE OF CORRECTION

PATENT NO. : 6,519,186 B2
DATED : February 11, 2003
INVENTOR(S) : Satoru Tamada et al.

It is certified that error appears in the above-identified patent and that said Letters Patent is hereby corrected as shown below:

<u>Title page, Item [54] and Column 1, lines 1-3,</u>
Title, change from "NON-VOLATILE SEMICONDUCTOR MEMORY DEVICE CONFIGURED TO READ DATA AT A HIGH SPEED" to -- NON-VOLATILE SEMICONDUCTOR MEMORY DEVICE CONFIGURED TO READ CONTROL DATA AT HIGH SPEED --.

Signed and Sealed this

Twentieth Day of July, 2004

JON W. DUDAS
*Acting Director of the United States Patent and Trademark Office*